US012602083B2

(12) United States Patent
Choi et al.

(10) Patent No.: US 12,602,083 B2
(45) Date of Patent: Apr. 14, 2026

(54) STRETCHABLE DISPLAY HAVING NEGATIVE POISSON'S RATIO

(71) Applicant: SEOUL NATIONAL UNIVERSITY R&DB FOUNDATION, Seoul (KR)

(72) Inventors: Insuk Choi, Seoul (KR); Yu-Ki Lee, Seoul (KR); Hyunwoo Kim, Seoul (KR); Jaeyoung Choi, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 435 days.

(21) Appl. No.: 18/250,057

(22) PCT Filed: Aug. 12, 2021

(86) PCT No.: PCT/KR2021/010719
§ 371 (c)(1),
(2) Date: Apr. 21, 2023

(87) PCT Pub. No.: WO2022/085909
PCT Pub. Date: Apr. 28, 2022

(65) Prior Publication Data
US 2023/0400884 A1      Dec. 14, 2023

(30) Foreign Application Priority Data
Oct. 22, 2020     (KR) ........................ 10-2020-0137703

(51) Int. Cl.
*G06F 3/041*          (2006.01)
*G06F 1/16*           (2006.01)
*H01L 25/075*         (2006.01)

(52) U.S. Cl.
CPC ........ *G06F 1/1652* (2013.01); *H01L 25/0753* (2013.01)

(58) Field of Classification Search
CPC ....... G06F 1/1652; H01L 24/66; H01L 24/69; H01L 25/0753; H01L 20/857;
(Continued)

(56) References Cited

U.S. PATENT DOCUMENTS 7,834,424 B2    11/2010  Peumans et al.
8,072,045 B2    12/2011  Peumans et al.
(Continued)

FOREIGN PATENT DOCUMENTS

CN        103177656 A      6/2013
CN        110176473 A      8/2019
(Continued)

OTHER PUBLICATIONS

Huang et al., "Stretchable silicon sensor networks for structural health monitoring", Proc. SPIE 6174, Smart Structures and Materials 2006: Sensors and Smart Structures Technologies for Civil, Mechanical, and Aerospace Systems, 617412 (Apr. 11, 2006).

*Primary Examiner* — Joe H Cheng
(74) *Attorney, Agent, or Firm* — Vorys, Sater, Seymour and Pease LLP; Mih Suhn Koh

(57)          ABSTRACT

Provided is a stretchable display having a negative Poisson's ratio including: a first core on which a first light-emitting element is installed; a second core positioned next to the first core and on which a second light-emitting element is installed; multiple first wires coming out from one side of the first core and wound in one direction around the first core; and multiple second wires coming out from one side of the second core and wound in the opposite direction to the first wire around the second core, wherein any of the multiple first wires and any of the multiple second wires are connected between the first core and the second core in a connection part, and when a distance between the first core and the second core increases, the first wires are unwound (Continued)

while the first core rotates, and the second wires are unwound while the second core rotates.

8 Claims, 25 Drawing Sheets

(58) Field of Classification Search
CPC .. H10K 59/121; H10K 59/131; H10K 59/351; H10K 59/353; H10K 77/111; H10K 2102/311

See application file for complete search history.

(56) References Cited

U.S. PATENT DOCUMENTS

| | | | |
|---|---|---|---|
| 8,766,535 | B2 | 7/2014 | Sonoyama et al. |
| 9,583,469 | B2 | 2/2017 | Hsieh |
| 9,691,996 | B2 | 6/2017 | Lee |
| 10,396,058 | B2 | 8/2019 | Hsieh |
| 11,502,152 | B2 | 11/2022 | Zhu et al. |
| 2008/0064125 | A1 | 3/2008 | Peumans et al. |
| 2010/0271293 | A1 | 10/2010 | Sonoyama et al. |
| 2011/0042832 | A1 | 2/2011 | Peumans et al. |
| 2015/0255440 | A1 | 9/2015 | Hsieh |
| 2016/0240802 | A1 | 8/2016 | Lee |
| 2017/0179086 | A1 | 6/2017 | Hsieh |
| 2021/0408197 | A1 | 12/2021 | Zhu et al. |
| 2022/0104373 | A1 | 3/2022 | Zhang |

FOREIGN PATENT DOCUMENTS

| | | |
|---|---|---|
| JP | 2009093189 A | 4/2009 |
| KR | 10-2016-0101825 A | 8/2016 |
| KR | 10-2019-0103834 A | 9/2019 |
| KR | 20200052789 A | 5/2020 |
| KR | 10-2327014 B1 | 11/2021 |

90° ROTATION,1mm width
10% STRETCHING, 16MPa

180° ROTATION, 1mm width
30% STRETCHING, 30MPa

270° ROTATION,1mm width
40% STRETCHING, 33MPa

360° ROTATION,1mm width
50% STRETCHING, 34MPa

90° ROTATION, 0.5mm width
30% STRETCHING, 35MPa

180° ROTATION, 0.5mm width
100% STRETCHING, 36.3MPa

270° ROTATION, 0.5mm width
100% STRETCHING, 30MPa

360° ROTATION, 0.5mm width
100% STRETCHING, 29MPa

I – I'

90° ROTATION STRUCTURE

180° ROTATION STRUCTURE

270° ROTATION STRUCTURE

360° ROTATION STRUCTURE

STRETCHABLE DISPLAY HAVING NEGATIVE POISSON'S RATIO

CROSS-REFERENCE TO RELATED APPLICATIONS

This application is a 371 of PCT/KR2021/010719 filed on Aug. 12, 2021, which claims the benefit of priority from Korean Patent Application No. 10-2020-0137703 filed on Oct. 22, 2020, the contents of each of which are incorporated herein by reference in its entirety.

TECHNICAL FIELD

The present invention relates to a stretchable display, and more particularly, to a stretchable display that has a negative Poisson's ratio and thus may minimize distortion of an image or video transmitted to the display because the display is also stretched in the other direction when the display is stretched in one direction.

BACKGROUND ART

Displays are used as devices for transmitting information to a user in various electronic devices including smart phones.

The existing displays are based on a hard substrate and cannot be stretched, and thus usage forms of the displays and places in which the displays are applied are limited. However, to solve this problem, a display that is stretchable, that is, stretchable display has been developed.

Recently developed stretchable displays are mainly focused on implementation through introduction of new materials. That is, a substrate is made of a material having elasticity, and thus the stretchable display is implemented. Another method of implementing the stretchable display is to use a horseshoe-shaped wiring line.

However, the stretchable display implemented through the introduction of new materials is very expensive, and an aspect ratio of the display is not maintained due to contraction in a direction perpendicular to a stretching direction during stretching. Likewise, the aspect ratio of the stretchable display using the horseshoe-shaped wiring line is also not maintained during the stretching, and thus the aspect ratio of the transmitted image or video is not maintained and distorted. In particular, the stretchable display using the horseshoe-shaped wiring line has a very low aperture ratio and a limited stretching limit.

As a result, a stretchable display having a new structure, in which a screen is not distorted even during the stretching and the degree of integration of light emitting elements may be improved is required.

DISCLOSURE

Technical Problem

Displays are used as devices for transmitting information to a user in various electronic devices including smart phones.

The existing displays are based on a hard substrate and cannot be stretched, and thus usage forms of the displays and places in which the displays are applied are limited. However, to solve this problem, a display that is stretchable, that is, stretchable display has been developed.

Recently developed stretchable displays are mainly focused on implementation through introduction of new materials. That is, a substrate is made of a material having elasticity, and thus the stretchable display is implemented. Another method of implementing the stretchable display is to use a horseshoe-shaped wiring line.

However, the stretchable display implemented through the introduction of new materials is very expensive, and an aspect ratio of the display is not maintained due to contraction in a direction perpendicular to a stretching direction during stretching. Likewise, the aspect ratio of the stretchable display using the horseshoe-shaped wiring line is also not maintained during the stretching, and thus the aspect ratio of the transmitted image or video is not maintained and distorted. In particular, the stretchable display using the horseshoe-shaped wiring line has a very low aperture ratio and a limited stretching limit.

As a result, a stretchable display having a new structure, in which a screen is not distorted even during the stretching and the degree of integration of light emitting elements may be improved, is required.

Technical Solution

A stretchable display having a negative Poisson's ratio according to an embodiment of the present invention includes a first core in which a first light emitting element is installed, a second core which is positioned next to the first core and in which a second light emitting element is installed, a plurality of first wires protruding from one side of the first core and wound around the first core in one direction, and a plurality of second wires protruding from one side of the second core and wound around the second core in a direction opposite to the first wires, wherein any one of the plurality of first wires and any one of the plurality of second wires are connected at a connector between the first core and the second core, and when a distance between the first core and the second core increases, the plurality of first wires wound around the first core are unwound as the first core rotates, and the plurality of second wires wound around the second core are unwound as the second cores rotates.

In an example, the stretchable display may further include a third core which is positioned next to the first core and in which a third light emitting element is installed, and a plurality of third wires protruding from one side of the third core and wound around the third core in the direction opposite to the first wires, wherein the other one of the plurality of first wires and any one of the plurality of third wires are connected at a connector between the first core and the third core, and when the distance between the first core and the second core increases, as the plurality of first wires wound around the first core are unwound, a distance between the first core and the third core also increases.

In an example, each of the plurality of first wires may protrude from the one side of the first core and may be wound around the first core at an angle of 90° or more.

A stretchable display having a negative Poisson's ratio, which is stretched or contracted in an X direction and an Y direction includes a first core in which a first light emitting element is installed, a second core which is positioned on one side of the first core in the X direction and in which a second light emitting element is installed, a third core which is positioned on one side of the first core in the Y direction and in which a third light emitting element is installed, a fourth core which is positioned on one side of the second core in the Y direction and one side of the third core in the X direction and in which a fourth light emitting element is installed, a plurality of first wires protruding from the one side of the first core and wound around the first core in a counterclockwise direction, a plurality of second wires protruding from the one side of the second core and wound around the second core in a clockwise direction, a plurality of third wires protruding from the one side of the third core and wound around the third core in a clockwise direction, and a plurality of fourth wires protruding from one side of the fourth core and wound around the fourth core in a counterclockwise direction, wherein any one of the plurality of first wires and any one of the plurality of second wires are connected at a first connector between the first core and the second core, the other one of the plurality of first wires and any one of the plurality of third wires are connected at a second connector between the first core and the third core, the other one of the plurality of second wires and any one of the plurality of fourth wires are connected at a third connector between the second core and the fourth core, the other one of the plurality of third wires and the other one of the plurality of fourth wires are connected at a fourth connector between the third core and the fourth core.

The second connector and the third connected may be connected to each other through a connection wire, and when a force is applied to the stretchable display in the X direction to expand the stretchable display, the first core and the fourth core may rotate in the counterclockwise direction, the second core and the third core rotate in the clockwise direction, and thus distances between the first core to the fourth core in the X direction and the Y direction increase.

In another example, the stretchable display may further include an additional light emitting element installed in the connection wire. In this case, the additional light emitting element may be positioned on a different layer from the first core to the fourth core.

In another example, the stretchable display may further include a first reinforcement device formed outside the first connector in the Y direction and additionally connecting the first wire and the second wire of the first connector, and a second reinforcement device formed outside the fourth connector in the Y direction and additionally connecting the third wire and the fourth wire of the fourth connector. In this case, the Y direction may be a stretching direction in which the stretchable display is expanded or contracted by an external force, and the X direction may be a dependent direction in which the stretchable display is dependently expanded or contracted according to the expansion or contraction of the stretchable display in the stretching direction.

Advantageous Effects

In a stretchable display according to an embodiment of the present invention, a novel structure having a negative Poisson's ratio is used, and thus when the display is expanded or contracted in one direction, the display is expanded or contracted in a direction perpendicular to the one direction at the same time. Therefore, a problem that the aspect ratio of the display according to the related art is not maintained may be solved.

Meanwhile, even in the case of effects not explicitly mentioned herein, effects expected by the technical features of the present invention and described in the following specification and potential effects thereof are treated as those described in the specification of the present invention.

It is revealed that the accompanying drawings are exemplified as a reference for understanding the technical spirit of the present invention, and the scope of the present invention is not limited thereby.

MODE FOR INVENTION

Hereinafter, a configuration of the present invention guided by various embodiments of the present invention and an effect resulting from the configuration will be described with reference to the accompanying drawings. In the description of the present invention, when it is determined that widely known related functions are obvious to those skilled in the art and thus may make the subject matter of the present invention unclear, the detailed description will be omitted.

Figure 5:
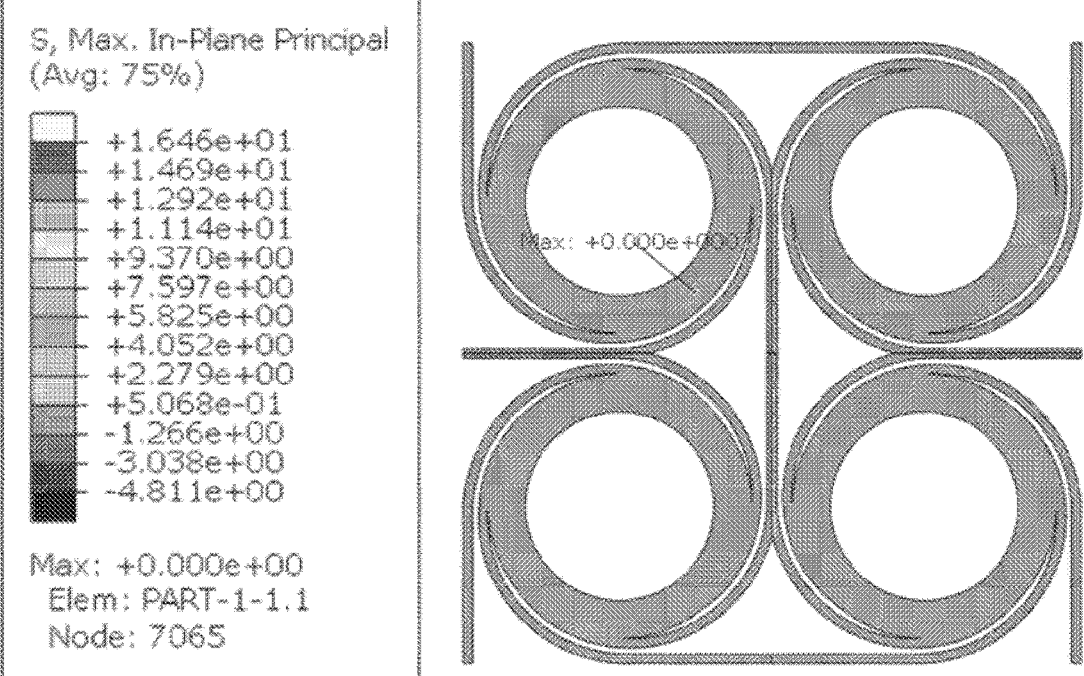
FIGS. 5 to 12 are a view identifying a maximum stretchable range and a yield strength within an elastic limit according to a width and a winding angle of the wire through finite element (FE) simulation.
Figure 6:
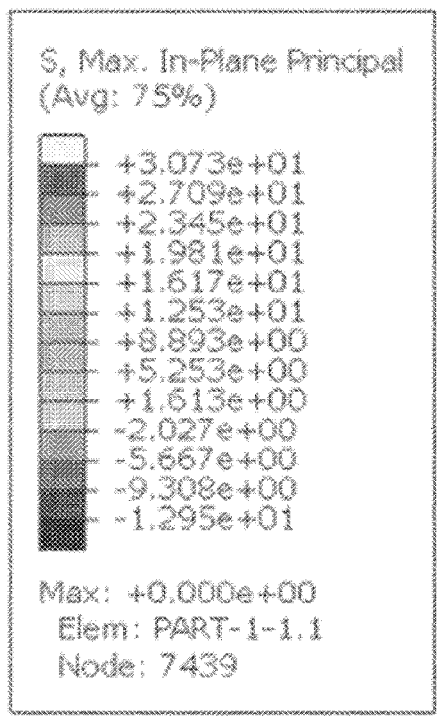
Figure 6:
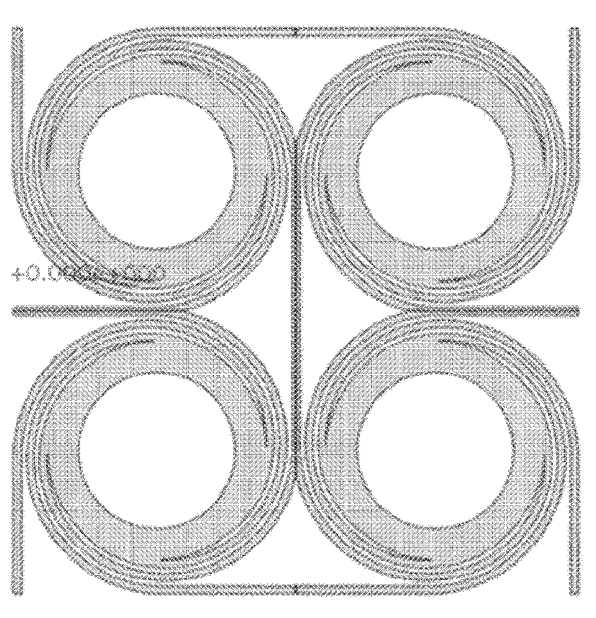
Figure 7:
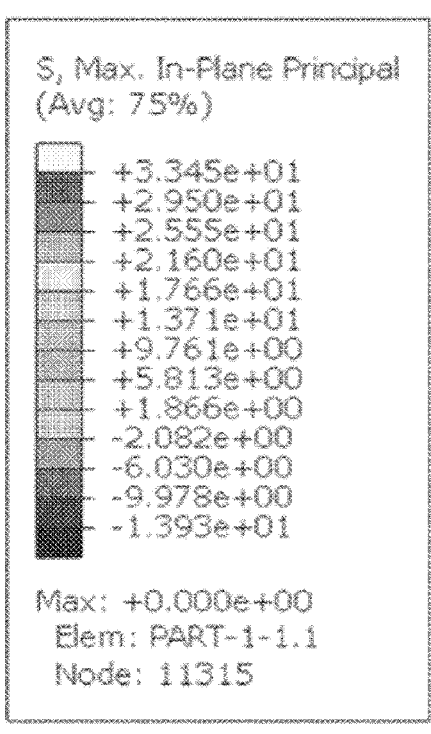
Figure 7:
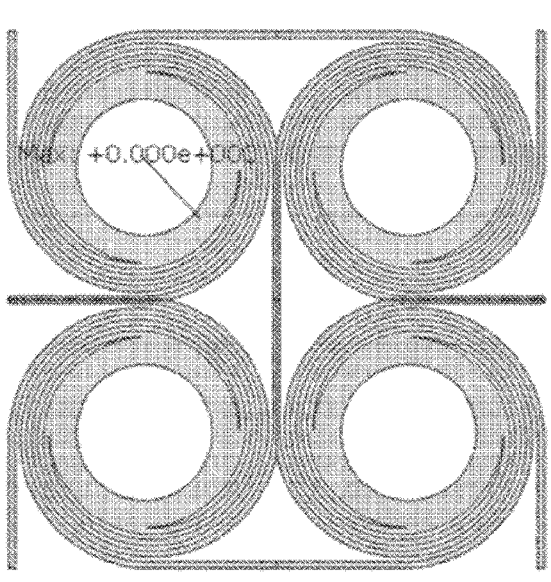
Figure 8:
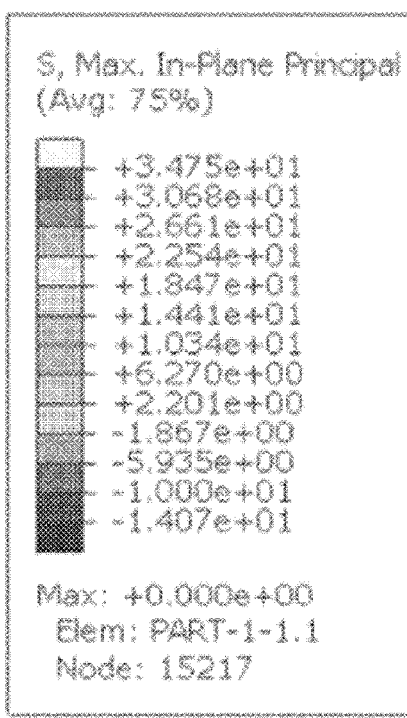
Figure 8:
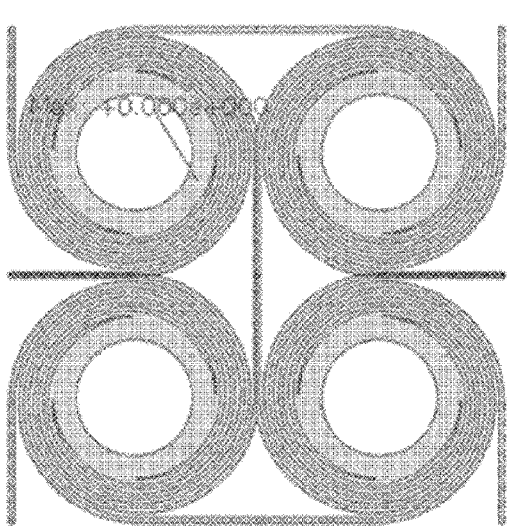
Figure 9:
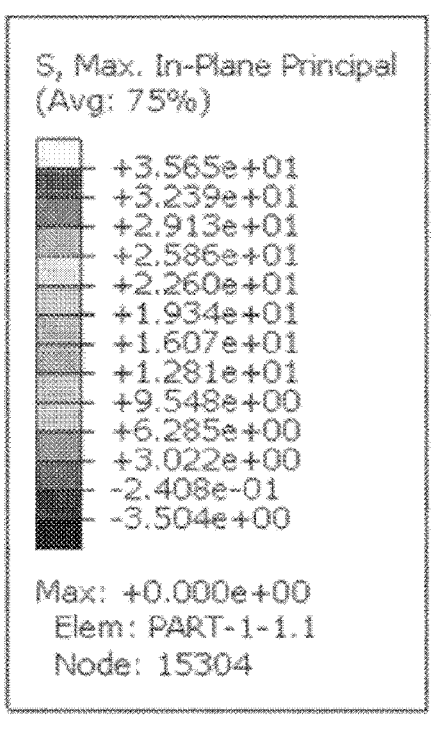
Figure 9:
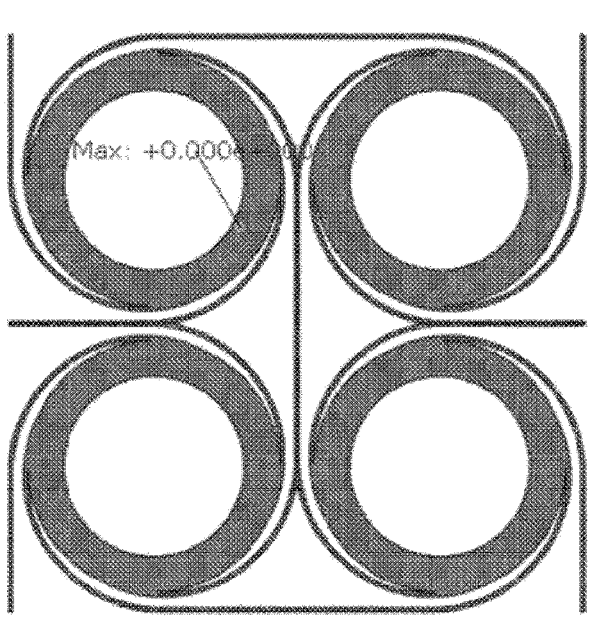

The stretchable display according to the embodiment of the present invention includes a plurality of light emitting units. In this case, the light emitting units may be grouped, FIG. 1 or 2 corresponds to an embodiment in which four light emitting units constitute one group, and FIG. 5 corresponds to an embodiment in which three light emitting units constitute one group. However, the present invention is not limited to those illustrated in the drawings attached to the present document, and the number of grouped light emitting units may be changed as long as the display has a negative Poisson's ratio.

Each of the light emitting unit includes a core, a light emitting element installed in the core, and a wire wound around the core.

A detailed description will be made with reference to FIGS. 1 and 2.

Figure 1:
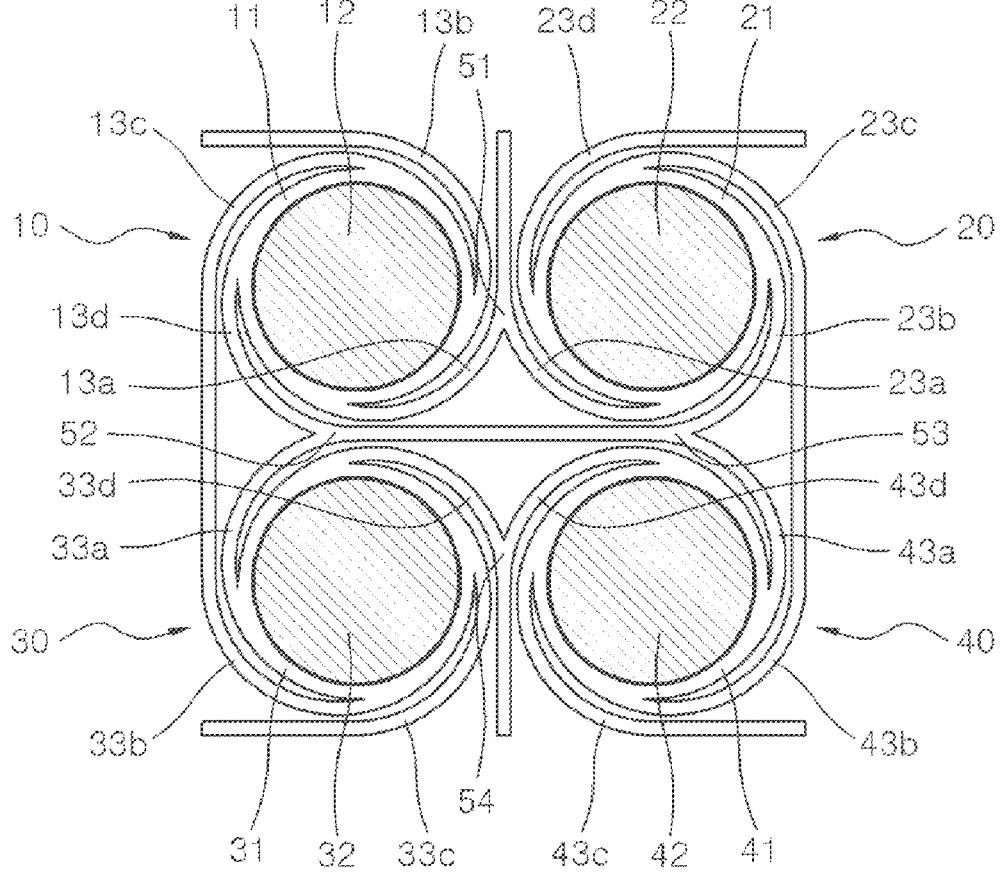
FIG. 1 is a schematic plan view of a stretchable display according to an embodiment of the present invention and is a schematic plan view when a winding angle of a wire is 90°.
Figure 2:
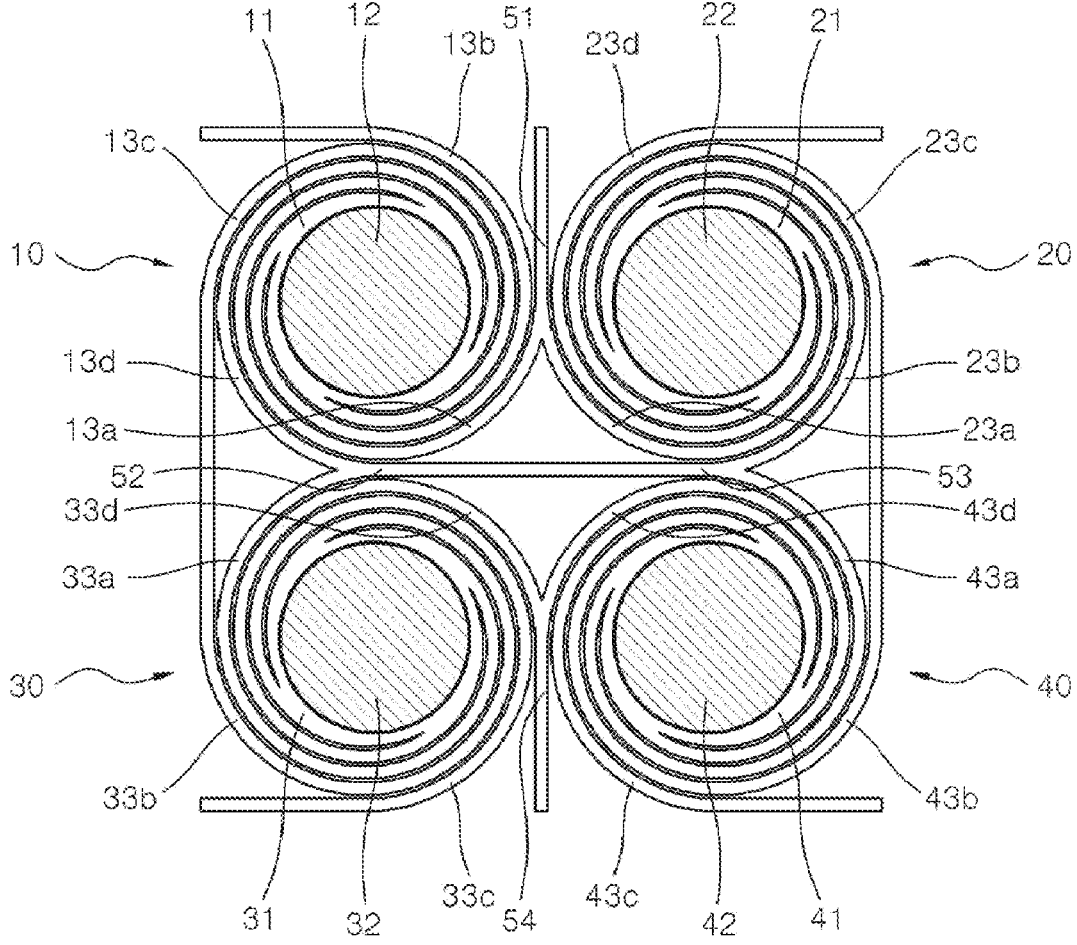
FIG. 2 is a schematic plan view of a stretchable display according to the embodiment of the present invention and is a schematic plan view when a winding angle of a wire is 270°.

FIG. 1 is a schematic plan view of a stretchable display according to an embodiment of the present invention and is a schematic plan view when a winding angle of a wire is 90°, and FIG. 2 is a schematic plan view of a stretchable display according to the embodiment of the present invention and is a schematic plan view when a winding angle of a wire is 270°.

In the stretchable display according to the embodiment of the present invention illustrated in FIGS. 1 and 2, four light emitting units 10, 20, 30, and 40 are included in one group.

The first light emitting unit 10 includes a first core 11 and a first light emitting element 12 installed in the first core 11. The first core 11 may have a circular shape, and a socket in which the first light emitting element 12 may be installed may be formed in a center of the first core 11. However, the shape of the first core 11 is not limited to the circular shape. A light emitting element according to the related art may be used as the first light emitting element 12. The first light emitting element 12 may be a circular light emitting element, but the present invention is not limited thereto, and a polygonal light emitting element may be used as the first light emitting element 12. A circuit for a light emitting element is installed inside the first core 11 and first wires 13*a*, 13*b*, 13*c*, and 13*d*. The first core 11 and the first wires 13*a*, 13*b*, 13*c*, and 13*d* may be made of one selected from the group consisting of polyvinyl alcohol (PVA), polylactic acid (PLA), acrylic, polycarbonate (PC), acrylonitrile butadiene styrene copolymer (ABS), copolyester (CPE), nylon, polypropylene (PP), and thermoplastic polyurethane (TPU), but the present invention is not limited thereto. The core and the wires may be formed of different materials. The plurality of first wires 13*a*, 13*b*, 13*c*, and 13*d* are installed on one side of the first core 11. In this case, the plurality of first wires 13*a*, 13*b*, 13*c*, and 13*d* are installed along an outer circumference of the first core 11 to be wound around the first core 11 in one direction. An angle at which the plurality of first wires 13*a*, 13*b*, 13*c*, and 13*d* are wound around the first core 11 may be 90° as illustrated in FIG. 1 or 270° as illustrated in FIG. 2, but the present invention is not limited thereto, and the first wires 13*a*, 13*b*, 13*c*, and 13*d* may be installed to wind the first core 11 one or more turns. A plurality of first wires may be installed along the first core 11, and when three or more first wires are installed, the degree of integration of the light emitting elements is advantageously improved. The respective first wires may be arranged such that intervals therebetween are the same, and when the first light emitting unit 10 includes n first wires, the first wires may be installed at an angle of 360/n°.

The second light emitting unit 20 is positioned next to the first light emitting unit 10. Here, a state in which the second light emitting unit 20 is positioned on a right side (in an X direction) of the first light emitting unit 10 will be described as a reference. The second light emitting unit 20 includes a second core 21 and a second light emitting element 22 installed in the second core 21. The second core 21 may have a circular shape, and a socket in which the second light emitting element 22 may be installed may be formed in a center of the second core 21. However, the shape of the second core 21 is not limited to the circular shape. A light emitting element according to the related art may be used as the second light emitting element 22. The second light emitting element 22 may be a circular light emitting element, but the present invention is not limited thereto, and a polygonal light emitting element may be used as the second light emitting element 22. A circuit for a light emitting element is installed inside the second core 21 and second wires 23*a*, 23*b*, 23*c*, and 23*d*. The second core 21 and the second wires 13*a*, 13*b*, 13*c*, and 13*d* may be made of one selected from the group consisting of polyvinyl alcohol (PVA), polylactic acid (PLA), acrylic, polycarbonate (PC), acrylonitrile butadiene styrene copolymer (ABS), copolyester (CPE), nylon, polypropylene (PP), and thermoplastic polyurethane (TPU), but the present invention is not limited thereto. The core and the wires may be formed of different materials. The plurality of second wires 23*a*, 23*b*, 23*c*, and 23*d* are installed on one side of the second core 21. In this case, the plurality of second wires 23*a*, 23*b*, 23*c*, and 23*d* are installed along an outer circumference of the second core 21 to be wound around the second core 21 in a direction opposite to that of the first wires. For example, when the first wires are wound in a counterclockwise direction, the second wires are wound around the second core 21 in a clockwise direction. An angle at which the plurality of second wires 23*a*, 23*b*, 23*c*, and 23*d* are wound around the second core 21 may be 90° as illustrated in FIG. 1 or 270° as illustrated in FIG. 2, but the present invention is not limited thereto, and the second wires 23*a*, 23*b*, 23*c*, and 23*d* may be installed to wind the second core 21 one or more turns. A plurality of second wires may be installed along the second core 21, and when three or more second wires are installed, the degree of integration of the light emitting elements is advantageously improved. The respective second wires may be arranged such that intervals therebetween are the same, and when the second light emitting unit 20 includes n second wires, the second wires may be installed at an angle of 360/n°.

Figure 3:
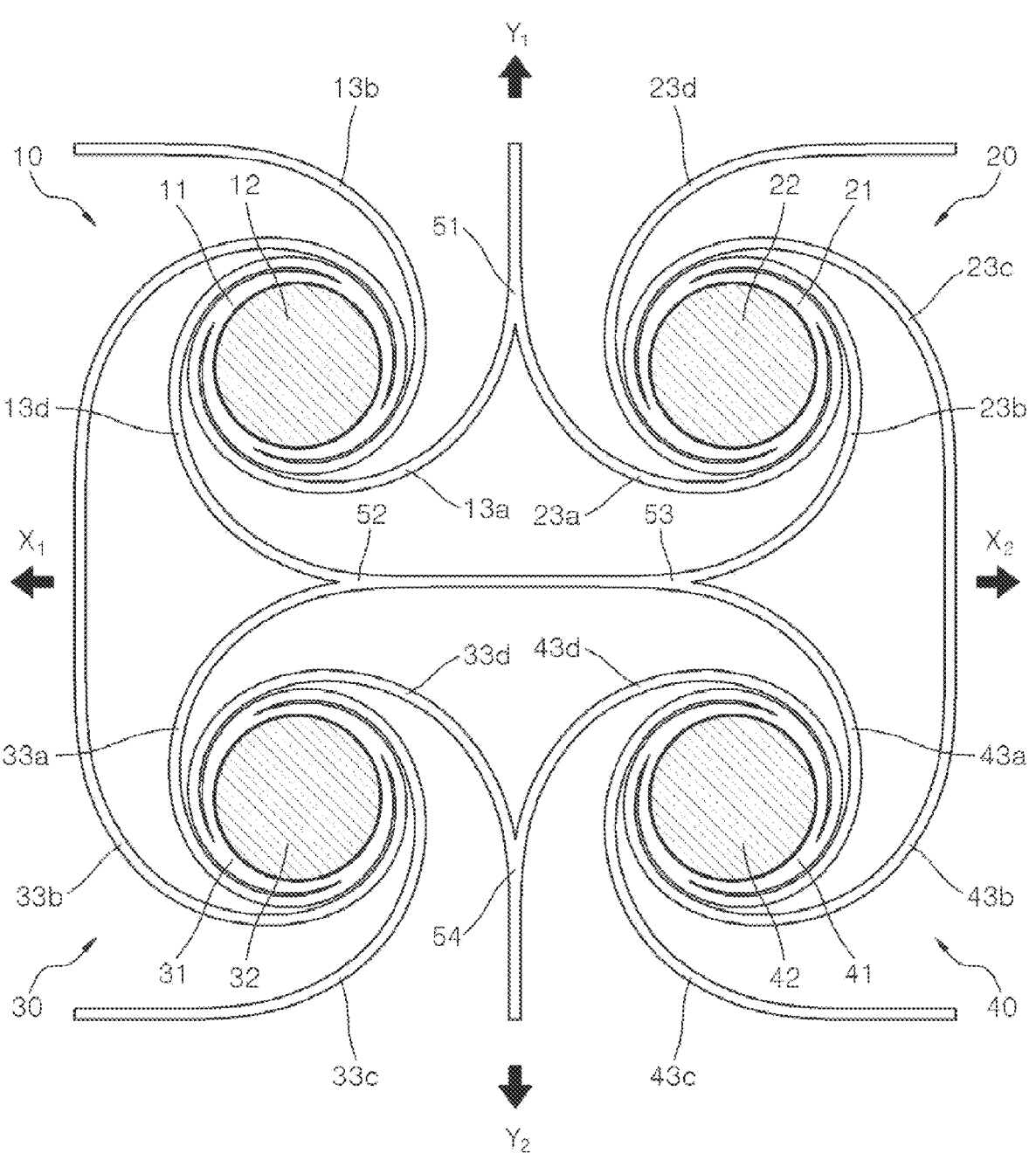
FIG. 3 is a schematic plan view of the stretchable display of FIG. 2 and is a reference diagram for describing that an interval between cores increases as the cores rotate when a display is expanded.

The third light emitting unit 30 is positioned next to the first light emitting unit Here, a state in which the third light emitting unit 30 is positioned on a lower side (in an Y direction) of the first light emitting unit 10 will be described as a reference. The third light emitting unit 30 includes a third core 31 and a third light emitting element 32 installed in the third core 31. The third core 31 may have a circular shape, and a socket in which the third light emitting element 32 may be installed may be formed in a center of the third core 31. However, the shape of the third core 31 is not limited to the circular shape. A light emitting element according to the related art may be used as the third light emitting element 32. The third light emitting element 32 may be a circular light emitting element, but the present invention is not limited thereto, and a polygonal light emitting element may be used as the third light emitting element 32. A circuit for a light emitting element is installed inside the third core 31 and third wires 33*a*, 33*b*, 33*c*, and 33*d*. The third core 31 and the third wires 33*a*, 33*b*, 33*c*, and 33*d* may be made of one selected from the group consisting of polyvinyl alcohol (PVA), polylactic acid (PLA), acrylic, polycarbonate (PC), acrylonitrile butadiene styrene copolymer (ABS), copolyester (CPE), nylon, polypropylene (PP), and thermoplastic polyurethane (TPU), but the present invention is not limited thereto. The core and the wires may be formed of different materials. The plurality of third wires 33a, 33b, 33c, and 33d are installed on one side of the third core 31. In this case, the plurality of third wires 33a, 33b, 33c, and 33d are installed along an outer circumference of the third core 31 to be wound around the third core 31 in a direction opposite to that of the first wires. For example, when the first wires are wound in a counterclockwise direction, the third wires are wound around the third core 31 in a clockwise direction. An angle at which the plurality of third wires 33a, 33b, 33c, and 33d are wound around the third core 31 may be 90° as illustrated in FIG. 1 or 270° as illustrated in FIG. 3, but the present invention is not limited thereto, and the third wires 33a, 33b, 33c, and 33d may be installed to wind the third core 31 one or more turns. A plurality of third wires may be installed along the third core 31, and when three or more third wires are installed, the degree of integration of the light emitting elements is advantageously improved. The respective third wires may be arranged such that intervals therebetween are the same, and when the third light emitting unit 30 includes n third wires, the third wires may be installed at an angle of 360/n°.

The fourth light emitting unit 40 is positioned next to the second light emitting unit 20 and the third light emitting unit 30. Here, a state in which the fourth light emitting unit 40 is positioned on a lower side (in an Y direction) of the second light emitting unit 20 and a right side (in an X direction) of the third light emitting unit 30 will be described as a reference. The fourth light emitting unit 40 includes a fourth core 41 and a fourth light emitting element 42 installed in the fourth core 41. The fourth core 41 may have a circular shape, and a socket in which the fourth light emitting element 42 may be installed may be formed in a center of the fourth core 41. However, the shape of the fourth core 41 is not limited to the circular shape. A light emitting element according to the related art may be used as the fourth light emitting element 42. The fourth light emitting element 42 may be a circular light emitting element, but the present invention is not limited thereto, and a polygonal light emitting element may be used as the fourth light emitting element 42. A circuit for a light emitting element is installed inside the fourth core 41 and fourth wires 43a, 43b, 43c, and 43d. The fourth core 41 and the fourth wires 43a, 43b, 43c, and 43d may be made of one selected from the group consisting of polyvinyl alcohol (PVA), polylactic acid (PLA), acrylic, polycarbonate (PC), acrylonitrile butadiene styrene copolymer (ABS), copolyester (CPE), nylon, polypropylene (PP), and thermoplastic polyurethane (TPU), but the present invention is not limited thereto. The core and the wires may be formed of different materials. The plurality of fourth wires 43a, 43b, 43c, and 43d are installed on one side of the fourth core 41. In this case, the plurality of fourth wires 43a, 43b, 43c, and 43d are installed along an outer circumference of the fourth core 41 to be wound around the fourth core 41 in the same direction as that of the first wires. The fourth wires 43a, 43b, 43c, and 43d are installed to be wound in a direction opposite to that of the second wires or the third wires. For example, when the first wires are wound in a counterclockwise direction, the fourth wires are also wound around the fourth core 41 in a clockwise direction. When the other light emitting units are divided on the basis of the first light emitting unit 10 in one group, the wires are wound around the cores of the second light emitting unit 20 and the third light emitting unit 30, which are most adjacent to the first light emitting unit 10, in a direction opposite to that of the wires of the first light emitting unit 10, and the wires are wound around the core of the fourth light emitting unit 40, which is positioned diagonally to the first light emitting unit 10 and does not satisfy a nearest neighbor, in the same direction as that of the wires of the first light emitting unit 20. An angle at which the plurality of fourth wires 43a, 43b, 43c, and 43d are wound around the fourth core 41 may be 90° as illustrated in FIG. 1 or 270° as illustrated in FIG. 2, but the present invention is not limited thereto, and the fourth wires 43a, 43b, 43c, and 43d may be installed to wind the fourth core 41 one or more turns. A plurality of fourth wires may be installed along the fourth core 41, and when three or more fourth wires are installed, the degree of integration of the light emitting elements is advantageously improved. The respective fourth wires may be arranged such that intervals therebetween are the same, and when the fourth light emitting unit 40 includes n fourth wires, the fourth wires may be installed at an angle of 360/n°.

One of the plurality of first wires and one of the plurality of second wires are connected at a connector between the first core and the second core. Referring to FIG. 1, the first wire 13a wound from a lower side of the first core 11 in a counterclockwise direction and the second wire 23a wound from a lower side of the second core 21 in a clockwise direction are connected at a first connection point 51.

Likewise, the other one of the plurality of first wires and one of the plurality of third wires are connected at a connector between the first core and the third core. Referring to FIG. 1, the first wire 13d wound from a left side of the first core 11 in a counterclockwise direction and the third wire 33a wound from a left side of the third core 31 in a clockwise direction are connected at a second connection point 52.

The other one of the plurality of second wires and one of the plurality of fourth wires are connected at a connector between the second core and the fourth core. Referring to FIG. 1, the second wire 23b wound from a right side of the second core 21 in a clockwise direction and the fourth wire 43a wound from a right side of the fourth core 41 in a counterclockwise direction are connected at a third connection point 53.

The other one of the plurality of third wires and the other one of the plurality of fourth wires are connected at a connector between the third core and the fourth core. Referring to FIG. 1, the third wire 33d wound from an upper side of the third core 31 in a clockwise direction and the fourth wire 43d wound from an upper side of the fourth core 41 in a counterclockwise direction are connected at a fourth connection point 54.

Referring to the above description and FIGS. 1 and 2, the grouped light emitting unit has an anti-chiral structure, more accurately, an anti-chiral-auxetic structure. The stretchable display according to the embodiment of the present invention has a negative Poisson's ratio through the anti-chiral structure, and furthermore, the degree of integration of the light emitting elements is improved. In particular, when the stretchable display has an anti-tetra-chiral structure as illustrated in FIGS. 1 and 2, and when the stretchable display is stretched in the X direction, the stretchable display is also stretched in the Y direction, and thus the stretching in a direction perpendicular to the stretching direction is induced. That is, even when the stretchable display is expanded, distortion of the transmitted image or video is advantageously reduced.

Figure 4:
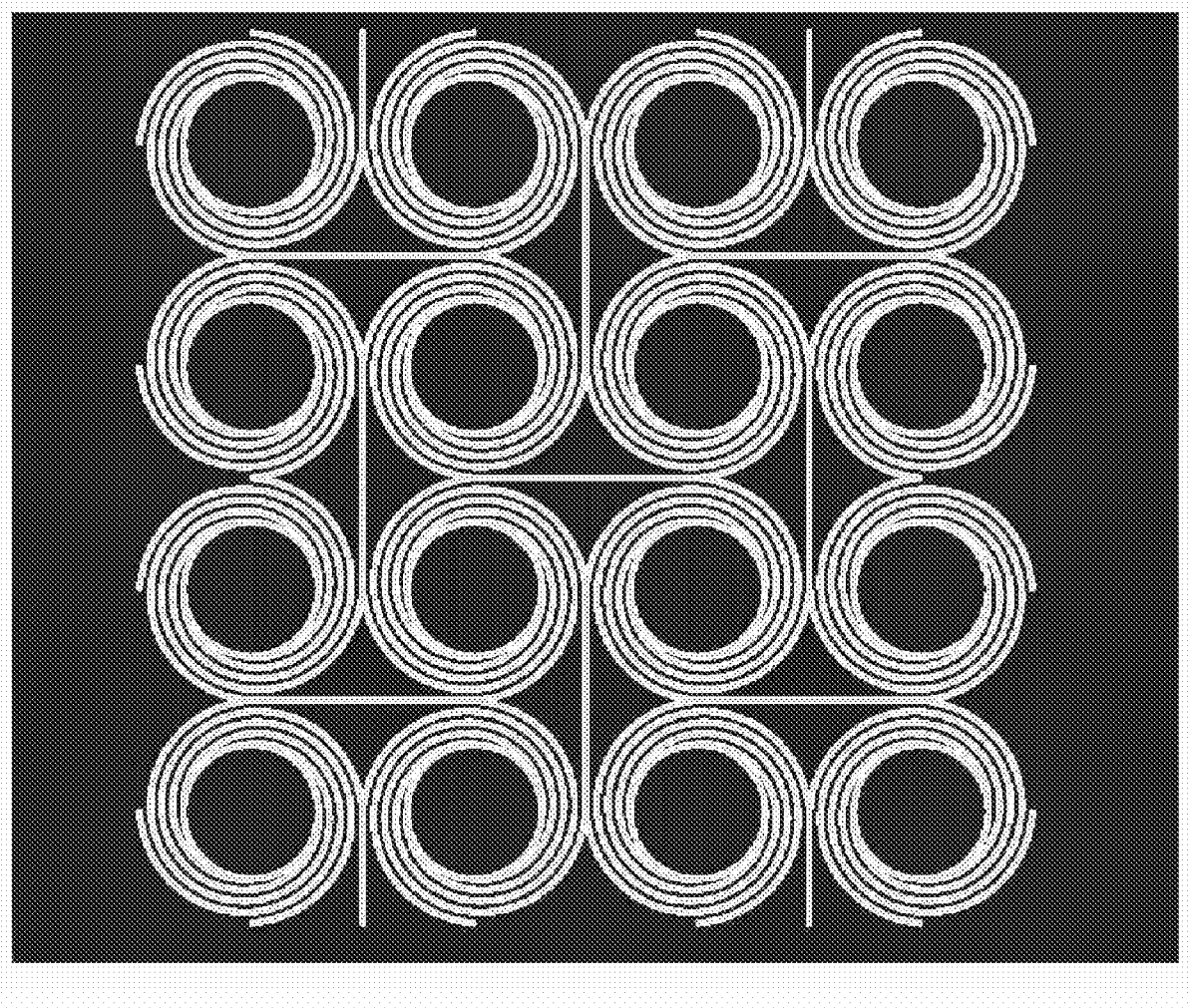
FIG. 4 is a schematic plan view of the stretchable display according to the embodiment of the present invention and illustrates a state in which grouped light emitting units are continuously arranged.

When the stretchable display has an anti-tetra-chiral structure as illustrated in FIGS. 1 and 2, a connection point is connected to another connection point through a connection wire 61. For example, the first connection point 51 and the second connection point 52 are connected through the connection wire 61. As illustrated in FIG. 4, it may be identified that, when the grouped light emitting units are repeatedly arranged, connection wires are arranged across an empty space defined by the four cores.

Referring to FIG. 3, when a distance between the first core 11 and the second core 21 increases in the X direction, the plurality of first wires 13*a*, 13*b*, 13*c*, and 13*d* wound around the first core 11 are unwound while the first core 11 rotates (R$_1$), and the plurality of second wires 23*a*, 23*b*, 23*c*, and 23*d* wound around the second core 21 are unwound while the second core 21 rotates (R$_2$). A direction in which the first core 11 rotates (R$_1$) and a direction in which the second core 21 rotates (R$_2$) are opposite to each other.

In this case, when the first core 11 moves in an X$_1$ direction and the second core 21 moves in an X$_2$ direction, the first core 11 rotates in an R$_1$ direction, and the second core 21 rotates in a R$_2$ direction. When the first core 11 rotates in the R$_1$ direction and the second core 21 rotates in the R$_2$ direction, all the first wires 13*a*, 13*b*, 13*c*, and 13*d* and all the second wires 23*a*, 23*b*, 23*c*, and 23*d* are unwound.

Accordingly, as the third core 31 and the fourth core 41 also rotate, all the third wires 33*a*, 33*b*, 33*c*, and 33*d* and all the fourth wires 43*a*, 43*b*, 43*c*, and 43*d* are unwound.

Thus, when the stretchable display is stretched in the X direction, as all the wires are unwound, a distance between the cores also increases in the Y direction. Therefore, when the stretchable display according to the embodiment of the present invention is stretched in the X direction, the stretchable display is also stretched in the Y direction, and as a result, the stretchable display has a negative Poisson's ratio.

It may be identified through comparison between FIGS. 1 and 2 that a stretchable range of the stretchable display increases as an angle at which the wire is wound around the core increases. Thus, when a wider stretchable range is required, an angle at which the wire is wound around the core may increase. However, since an area occupied by the light emitting element per unit area decreases when the angle at which the wire is wound around the core increases, the angle at which the wire is wound around the core may be adjusted in consideration of the stretchable range and the area occupied by the light emitting element per unit area. Further, the stretchable range of the stretchable display is related to a thickness of the wire.

FIG. 5 to 12 are a view identifying a maximum stretchable range and a yield strength according to a width and a winding angle of the wire through finite element (FE) simulation. A simulation condition is performed in which an inner diameter of the core is fixed to 1 cm, an outer diameter thereof is fixed to 2.4 cm, and the width and the winding angle of the wire change.

Referring to FIG. 5 to 12, it may be seen that the width of the wire decreases, the winding angle of the wire with respect to the core increases, and thus the maximum stretchable range of 100% or more may be achieved. Meanwhile, a strength in a state in which the maximum stretchable range of 100% is achieved indicates a strength required when the maximum stretchable range of 100% is achieved.

Figure 13:
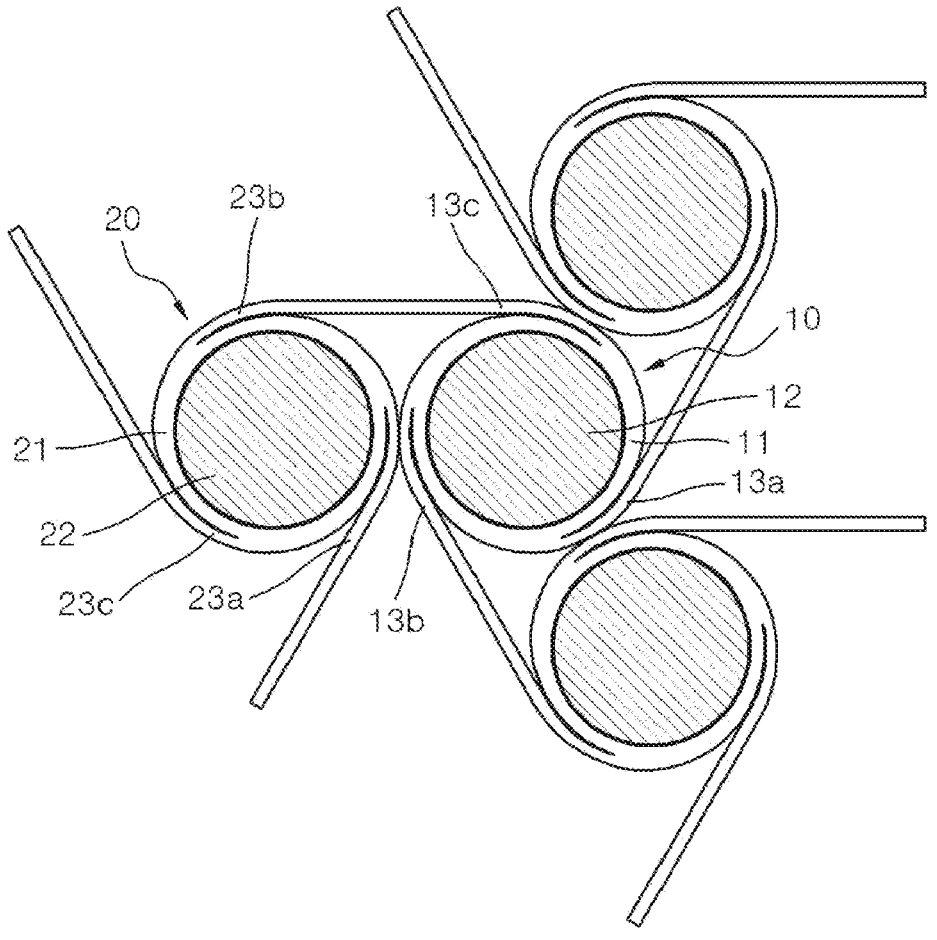
FIG. 13 is a schematic plan view of a stretchable display according to the embodiment of the present invention and is a schematic plan view when the core is disposed in a triangular shape.
Figure 14:
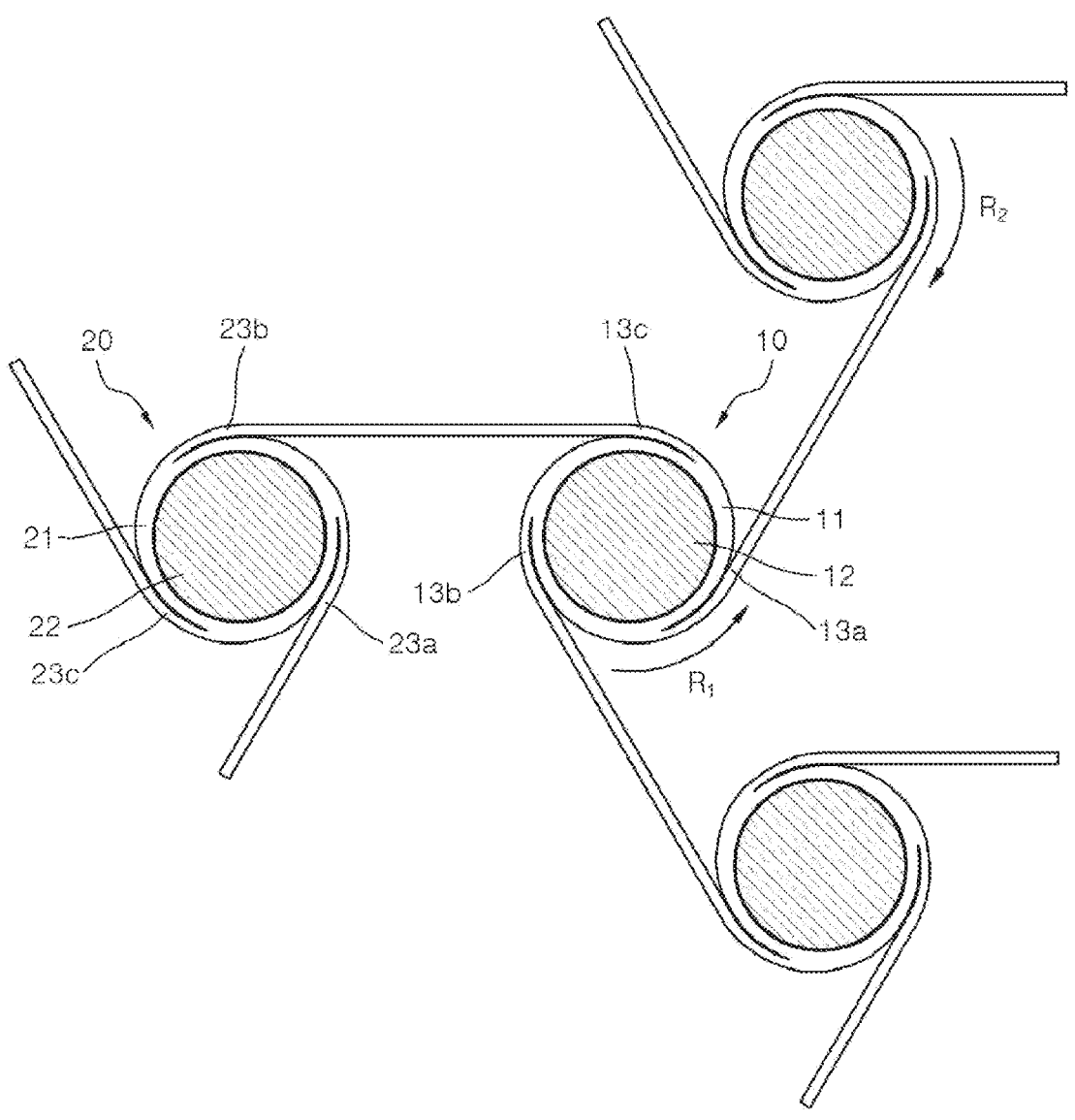
FIG. 14 is a schematic plan view of the stretchable display of FIG. 6 and is a reference diagram for describing that an interval between the cores increases as the cores rotate when the display is expanded.

FIG. 13 is a schematic plan view of a stretchable display according to the embodiment of the present invention and is a schematic plan view when the core is disposed in a triangular shape, and FIG. 14 is a schematic plan view of the stretchable display of FIG. 13 and is a reference diagram for describing that an interval between the cores increases as the cores rotate when the display is expanded.

Referring to FIGS. 13 and 14, three second light emitting units 20 are arranged at an angle of 120° around the first light emitting unit 10. The wires are wound on the cores of the first light emitting unit 10 and the second light emitting unit 20 in opposite directions, and according to the principle described in FIGS. 1 to 4, the stretching or contraction of the stretchable display in one direction causes stretching or contraction of the stretchable display in another direction.

Figure 15:
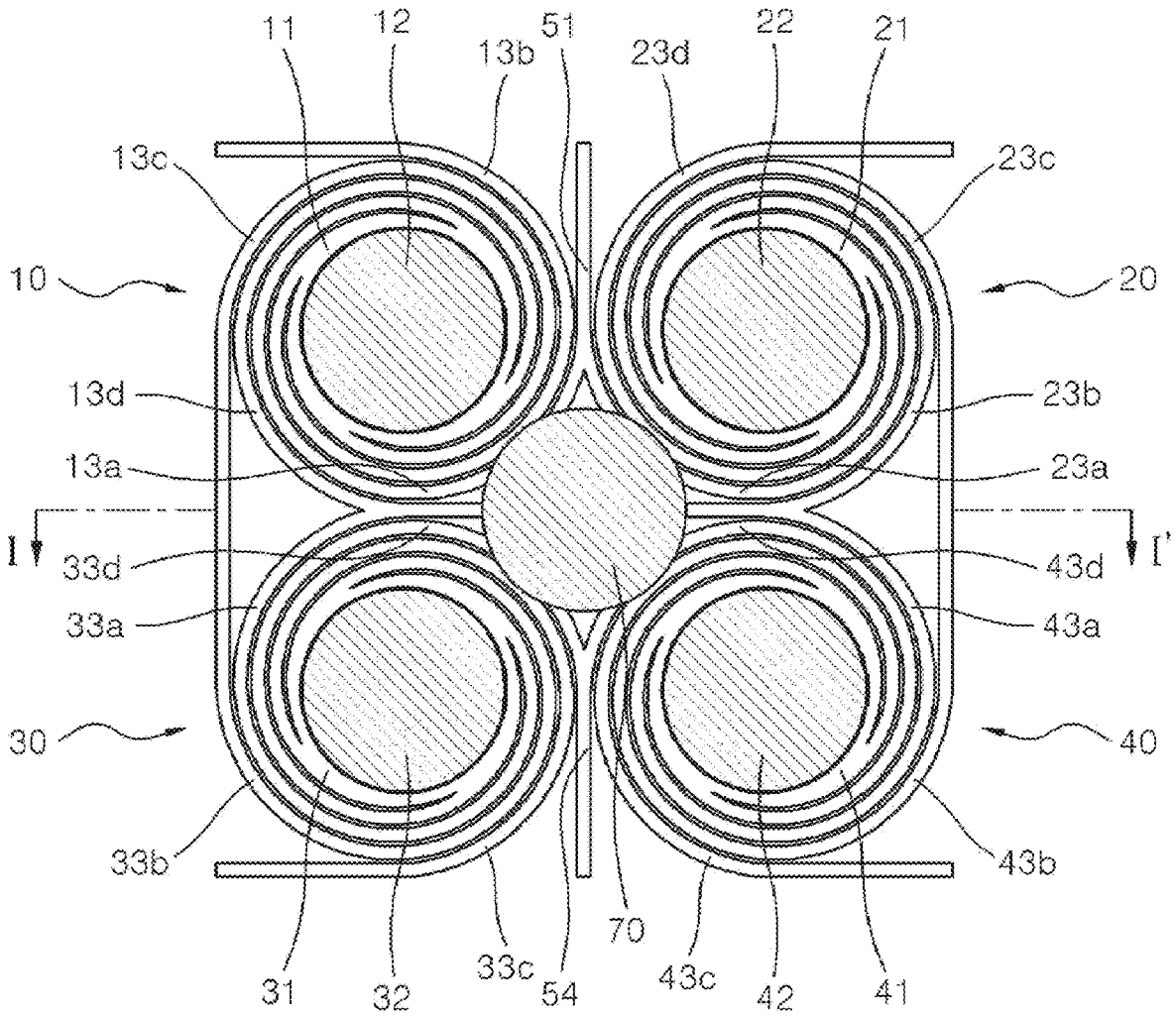
FIG. 15 is a schematic plan view of the stretchable display according to the embodiment of the present invention and is a reference diagram for describing that an additional light emitting element is installed in a connection wire.
Figure 16:
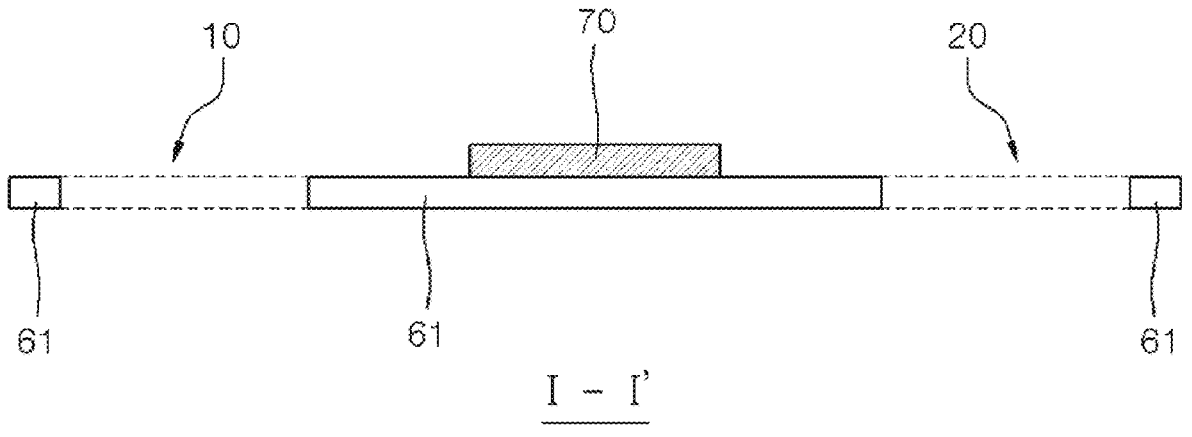
FIG. 16 is a schematic cross-sectional view along line I-I' of FIG. 15.

FIG. 15 is a schematic plan view of the stretchable display according to the embodiment of the present invention and is a reference diagram for describing that an additional light emitting element is installed in a connection wire, and FIG. 16 is a schematic cross-sectional view along line I-I' of FIG. 16.

Referring to FIGS. 1 and 2, it may be identified that, when the light emitting units 10, 20, 30, and 40 are arranged, an empty space is formed between the cores of each light emitting unit. The connection wire 61 crosses between these empty spaces, and when an additional light emitting element 70 is installed in the connection wire 61, the degree of integration of the light emitting elements may be further improved. In this case, as illustrated in FIG. 16, the additional light emitting element 70 may be positioned on a different layer from the first core to the fourth core so as not to interfere with an operation in which the first core to the fourth core move away from or approach each other.

When a circular light emitting element having a diameter of 0.7r (here, r is a diameter with respect to an outer circumference of the core) and a wire having a thickness of 0.032d (here, d is a thickness of the outer circumference of the core) are used, and when the angle at which the wire is wound around the core is 90°, the area occupied by the light emitting element per unit area is 28.4%, and when the angle is 270°, the area is 18.6%. However, when the angle at which the wire is wound around the core is 270°, and when the additional light emitting element is used, the area occupied by the light emitting element per unit area may increase to 37.2%.

Figure 17:
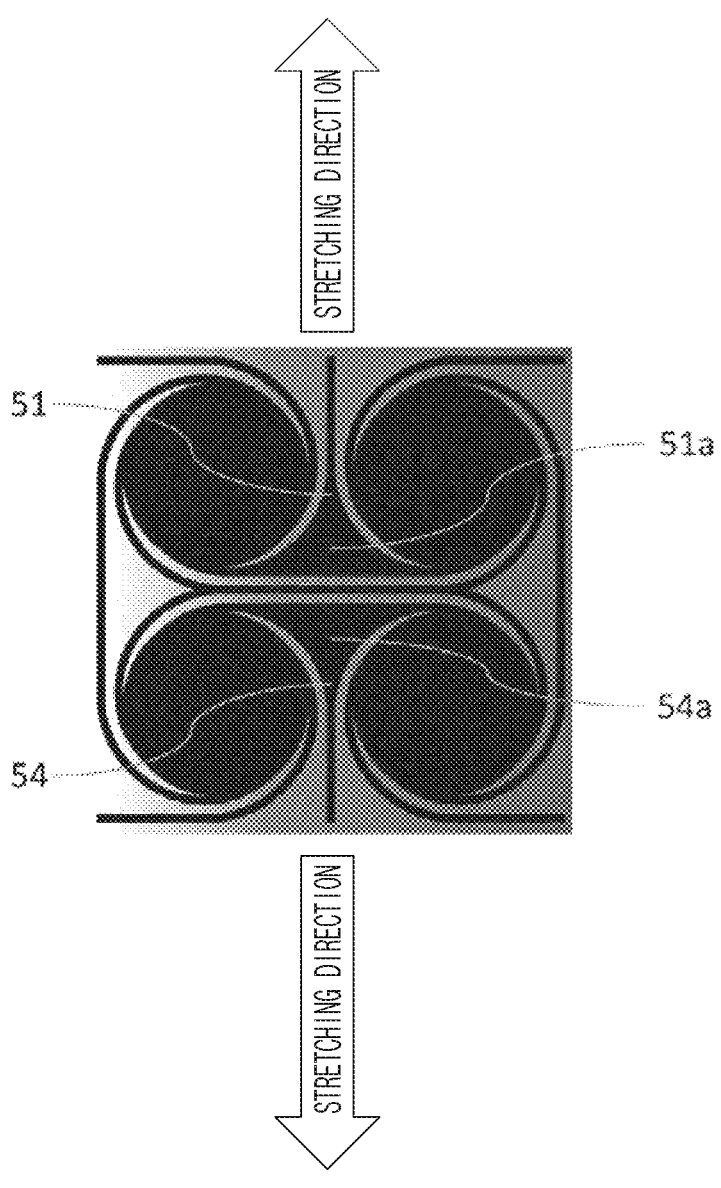
FIG. 17 is a schematic plan view display of a stretchable display according to another embodiment of the present invention.
Figure 18:
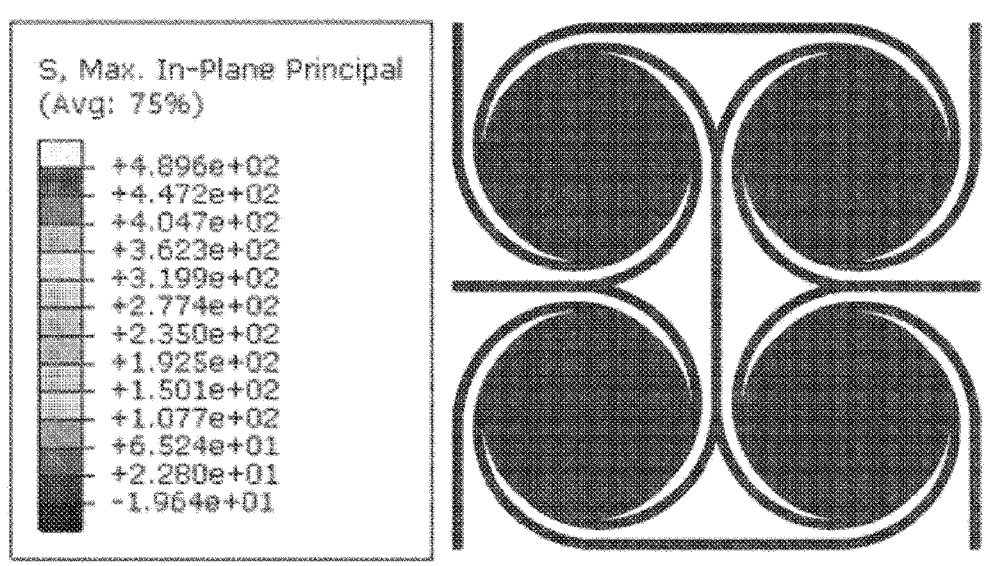
FIGS. 18 to 22 are a measurement of a Poisson's ratio value according to stretching of the stretchable display when a reinforcement part is not formed.
Figure 19:
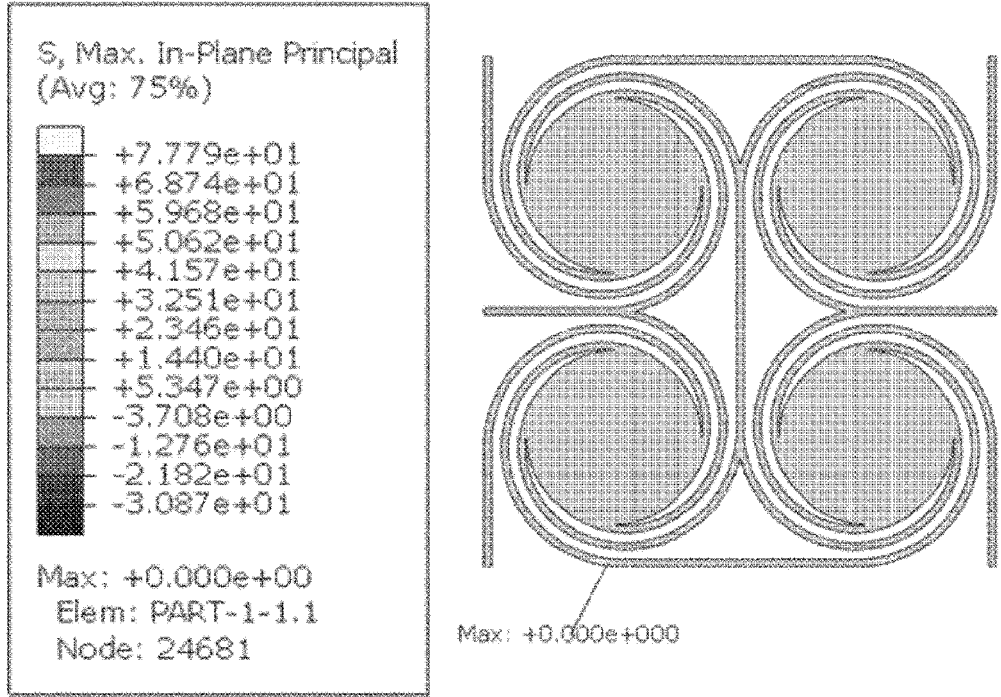
Figure 20:
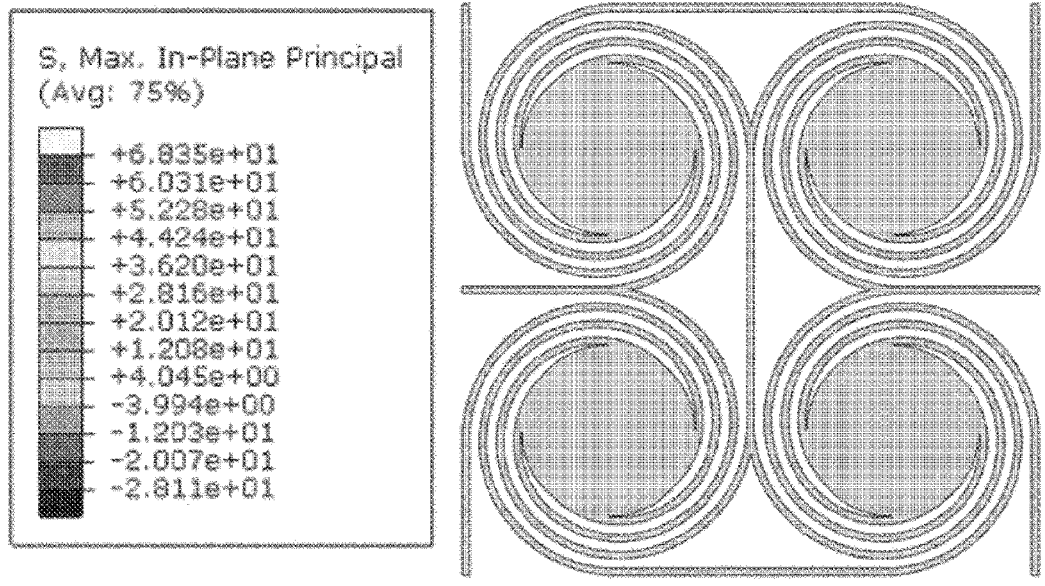
Figure 21:
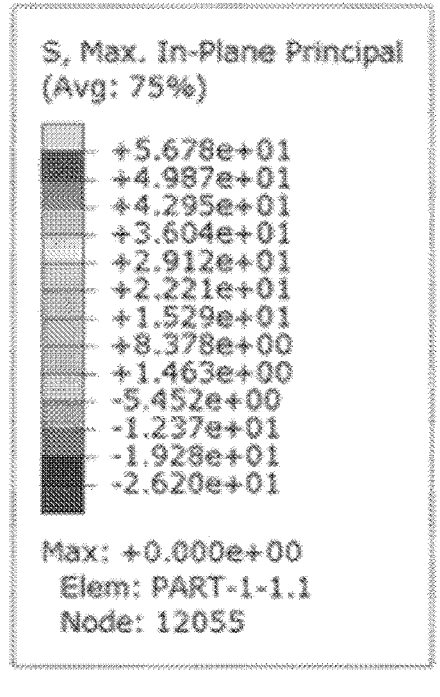
Figure 21:
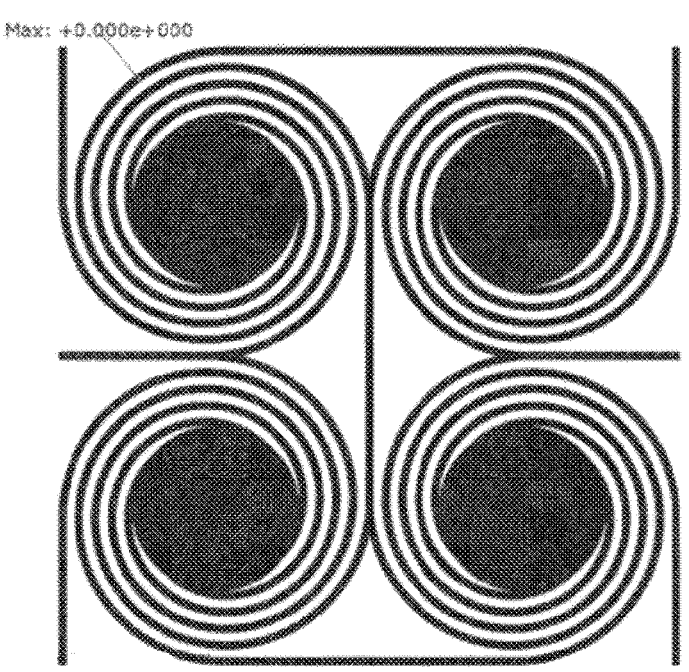
Figure 22:
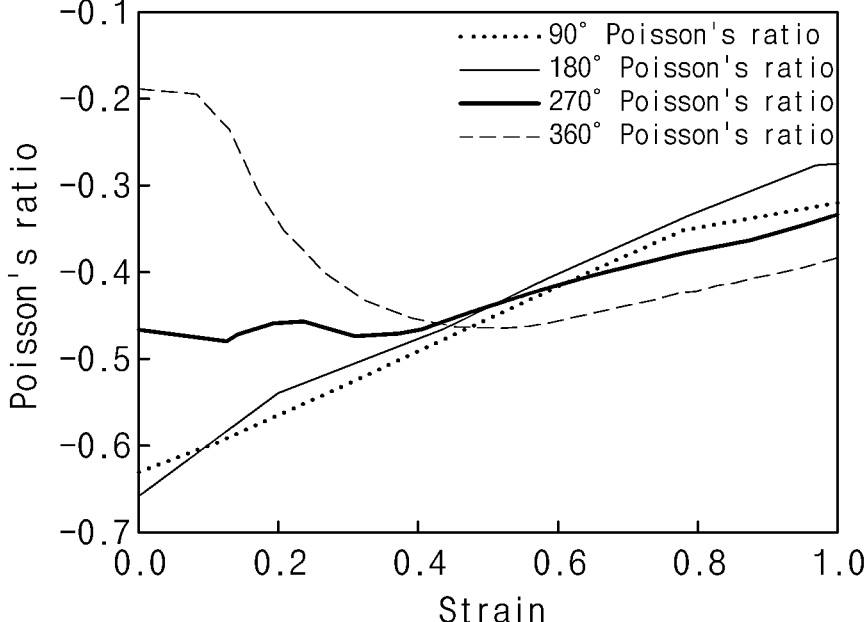

FIG. 17 is a schematic plan view display of a stretchable display according to another embodiment of the present invention. A description of the same configuration as that of the stretchable display according to the embodiment will be omitted.

The stretchable display according to another embodiment of the present invention further includes reinforcement devices 51*a* and 54*a* formed in the first connector 51 and the fourth connector 51.

Figure 10:
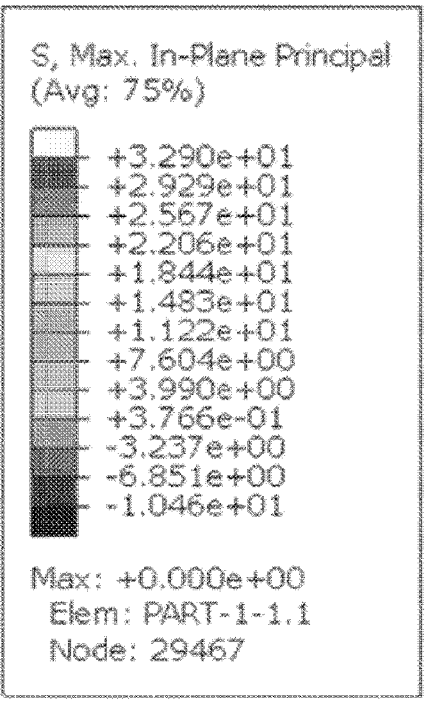
Figure 10:
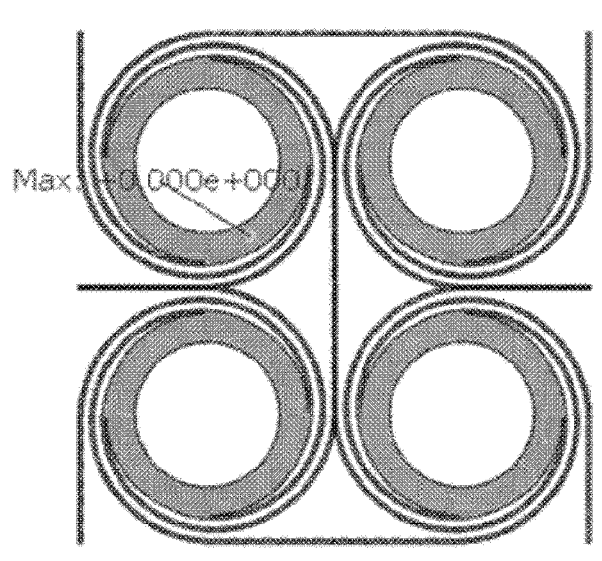
Figure 11:
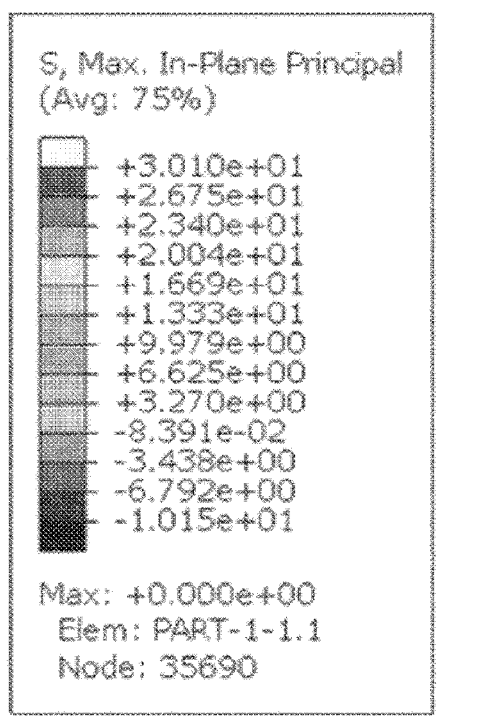
Figure 11:
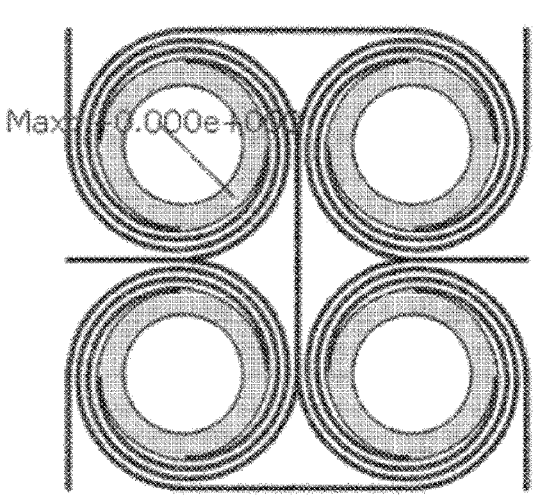
Figure 12:
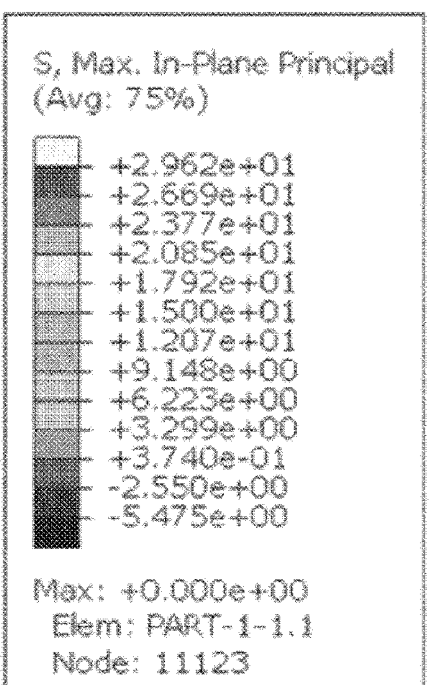
Figure 12:
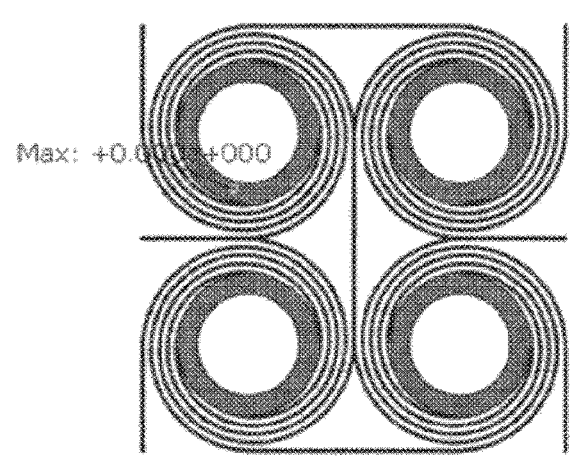

The connector is a portion at which the wires wound spirally around the cores meet each other and thus is a point at which two arcs meet each other. The reinforcement devices 51*a* and 54*a* are formed outside the point at which the two arcs meet each other. The reinforcement devices 51*a* and 54*a* connect the outsides of the point, at which the two arcs meet each other, to each other using lines or planes. FIG. 10 illustrates that the reinforcement devices 51*a* and 54*a* have surface shapes that completely fill the outsides of the connector, but the reinforcement devices 51*a* and 54*a* may also have a form in which one point between both wires outside the connector is connected to an additional connection wire. For example, the connection wires may be positioned at corners of the surfaces constituting the reinforcement devices 51*a* and 54*a*. In detail, the first reinforcement device 51*a* is formed outside the first connector in the Y direction and additionally connects the first wire and the second wire of the first connector, and the second reinforcement device 54*a* is formed outside the fourth connector in the Y direction and additionally connects the third wire and the fourth wire of the fourth connector.

The reinforcement devices 51*a* and 54*a* are formed in a connector corresponding to the stretching direction among the connectors. Here, the stretching direction is a direction in which the stretchable display is pulled by an external force. However, when the stretchable display of the present invention is pulled in the stretching direction, stretching occurs also in a vertical direction. In the present document, a direction in which the stretching occurs indirectly is referred to as a dependent direction.

Figure 23:
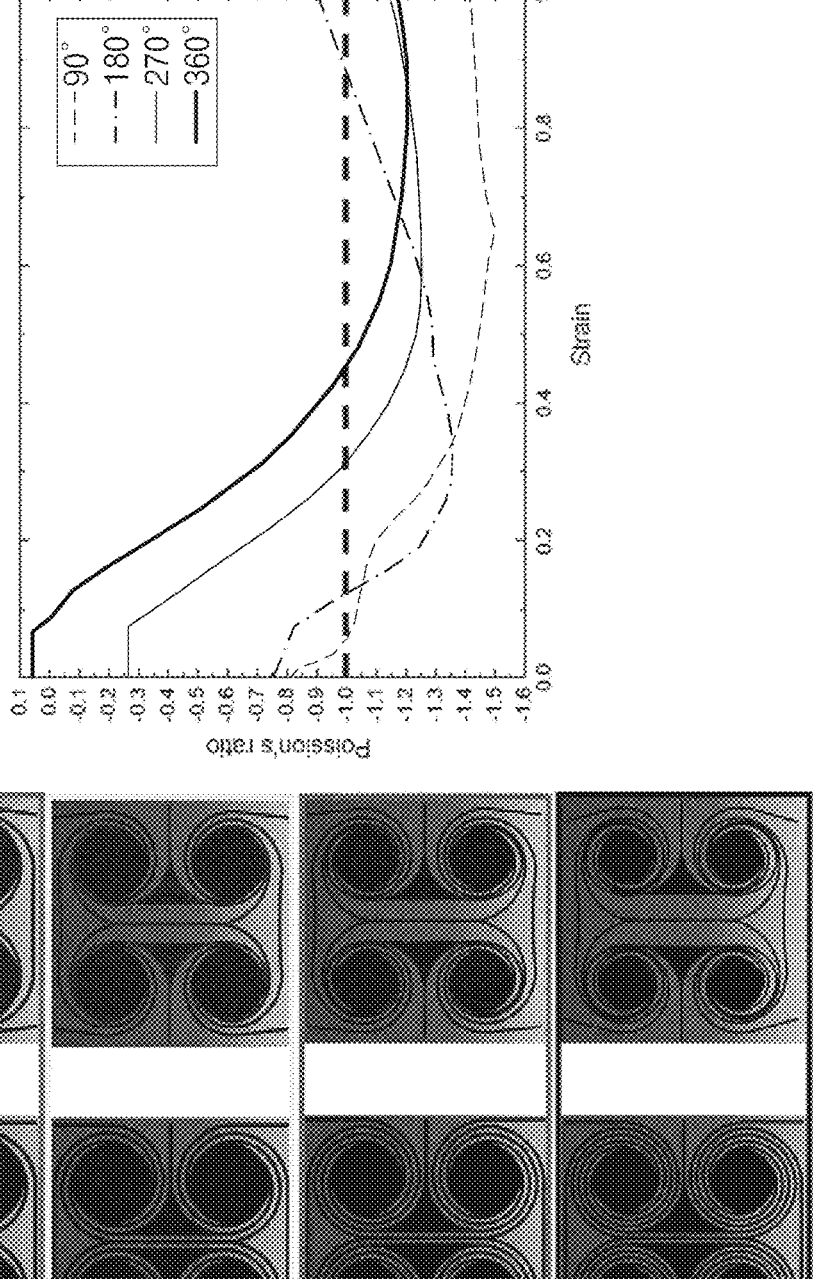
FIG. 23 is a measurement of a Poisson's ratio value according to stretching of the stretchable display when the reinforcement part is formed in a stretching direction.

FIGS. 18 to 22 is a measurement of a Poisson's ratio value according to stretching of the stretchable display when a reinforcement part is not formed, and FIG. 23 is a measurement of a Poisson's ratio value according to stretching of the stretchable display when the reinforcement part is formed in a stretching direction.

To minimize distortion caused by expansion or contraction of a screen transmitted to the stretchable display, it is most preferable that the Poisson's ratio is about –0.8 to –1.2 although the Poisson's ratio may change according to the aspect ratio.

It may be identified through comparison between FIGS. 18 to 22 and 23 that the stretchable display having the reinforcement devices has an average Poisson's ratio of –0.8 to –1.2. On the other hand, it may be identified that, when there is no reinforcement device, the Poisson's ratio is insufficient at a level of –0.4 to –0.5.

That is, when the reinforcement devices are further formed in the stretchable display of the present invention, the Poisson's ratio of the stretchable display is adjusted to a level of –0.8 to –1.2, and thus distortion caused by the expansion or contraction may be minimized.

Figure 24:
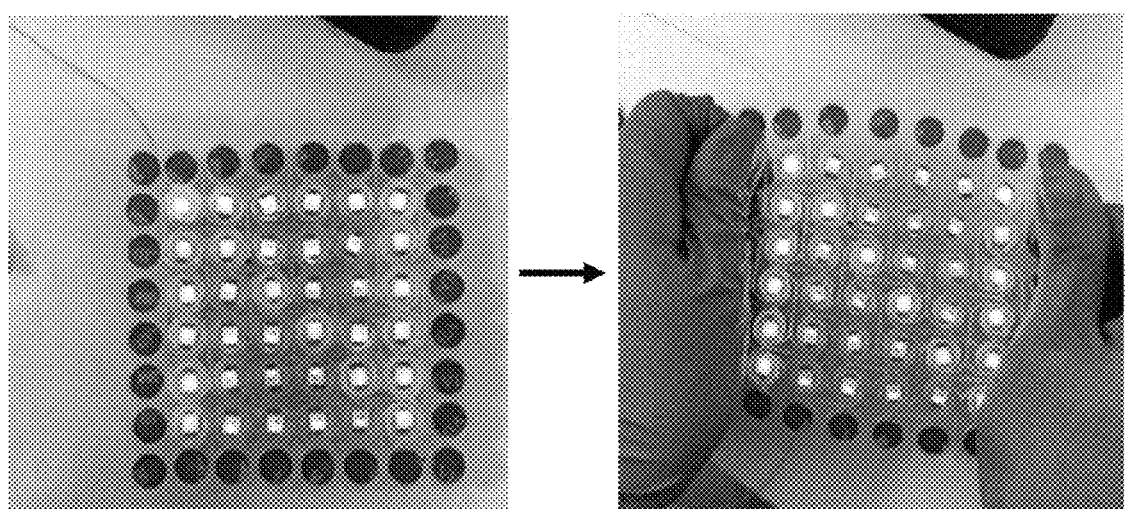
FIG. 24 is an actual implementation of the stretchable display according to the embodiment of the present invention and is a photograph illustrating that the stretchable display is stretched upward and downward when the stretchable display is stretched as the stretchable display is pulled toward both lateral sides.

FIG. 24 is an actual implementation of the stretchable display according to the embodiment of the present invention and is a photograph illustrating that the stretchable display is stretched upward and downward when the stretchable display is stretched as the stretchable display is pulled toward both lateral sides. Referring to FIG. 24, it may be identified that, even when the stretchable display according to the embodiment of the present invention is enlarged, a ratio of a character "N" is almost maintained.

Figure 25:
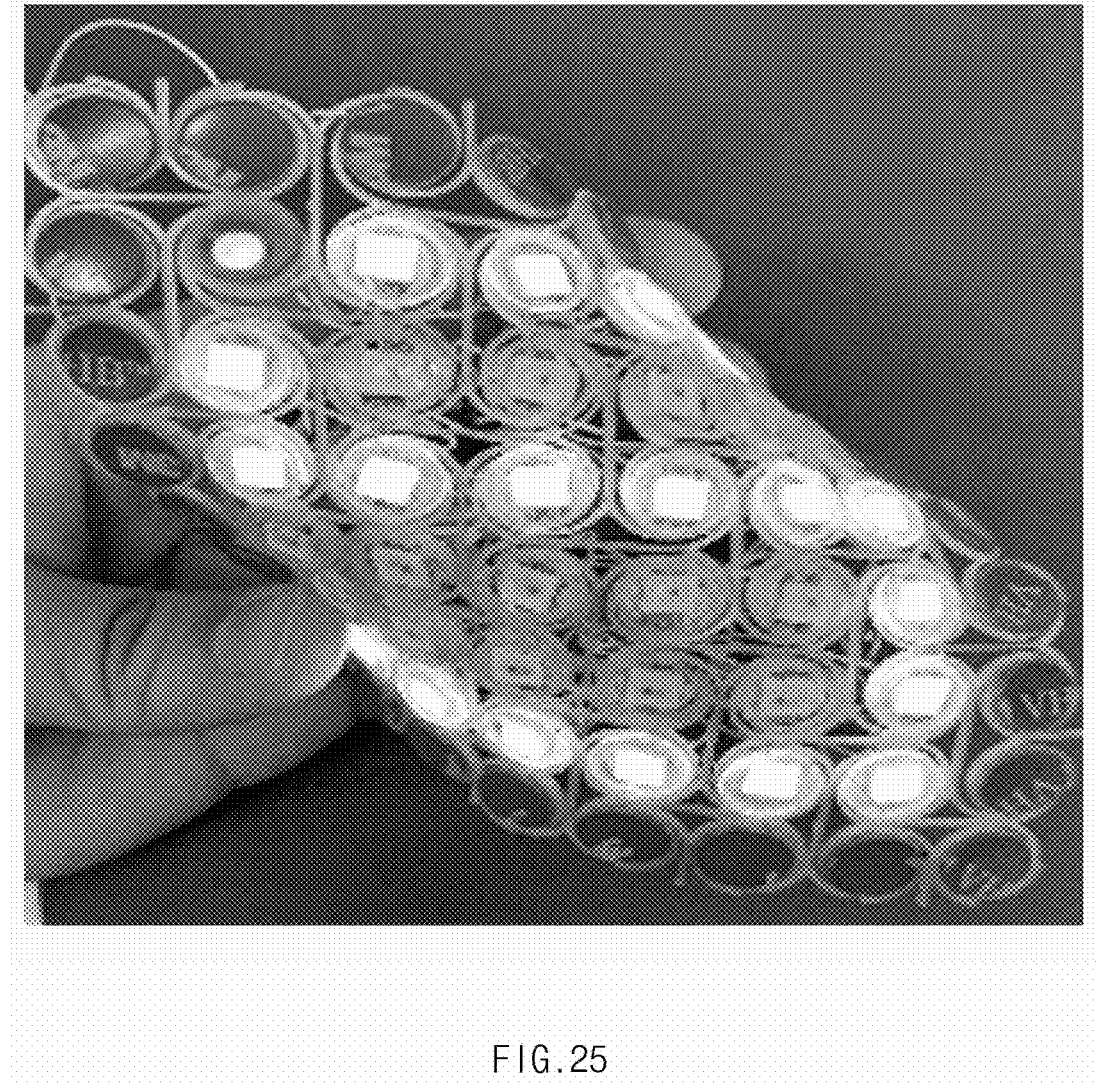
FIG. 25 is an actual implementation of the stretchable display according to the embodiment of the present invention and is a photograph obtained by shooting a state in which the stretchable display is bent.

Further, as illustrated in FIG. 25, the stretchable display according to the embodiment of the present invention may be freely bent. Thus, the stretchable display according to the embodiment of the present invention may be attached to a curved surface without peeling.

The protection scope of the present invention is not limited to the description and expression of the embodiments explicitly described above. Further, it is added once again that the protection scope of the present invention cannot be limited due to obvious changes or substitutions in the technical field to which the present invention pertains.

What is claimed:

1. A stretchable display having a negative Poisson's ratio, the stretchable display comprising:
   a first core in which a first light emitting element is installed;
   a second core which is positioned next to the first core and in which a second light emitting element is installed;
   a plurality of first wires protruding from one side of the first core and wound around the first core in one direction; and
   a plurality of second wires protruding from one side of the second core and wound around the second core in a direction opposite to the first wires,
   wherein any one of the plurality of first wires and any one of the plurality of second wires are connected at a connector between the first core and the second core, and
   when a distance between the first core and the second core increases, the plurality of first wires wound around the first core are unwound as the first core rotates, and the plurality of second wires wound around the second core are unwound as the second cores rotates.

2. The stretchable display of claim 1, further comprising:
   a third core which is positioned next to the first core and in which a third light emitting element is installed; and
   a plurality of third wires protruding from one side of the third core and wound around the third core in the direction opposite to the first wires,
   wherein the other one of the plurality of first wires and any one of the plurality of third wires are connected at a connector between the first core and the third core, and
   when the distance between the first core and the second core increases, as the plurality of first wires wound around the first core are unwound, a distance between the first core and the third core also increases.

3. The stretchable display of claim 1, wherein each of the plurality of first wires protrudes from the one side of the first core and wound around the first core at an angle of 90° or more.

4. A stretchable display having a negative Poisson's ratio, which is stretched or contracted in an X direction and an Y direction, the stretchable display comprising:
   a first core in which a first light emitting element is installed;
   a second core which is positioned on one side of the first core in the X direction and in which a second light emitting element is installed;
   a third core which is positioned on one side of the first core in the Y direction and in which a third light emitting element is installed;
   a fourth core which is positioned on one side of the second core in the Y direction and one side of the third core in the X direction and in which a fourth light emitting element is installed;
   a plurality of first wires protruding from the one side of the first core and wound around the first core in a counterclockwise direction;
   a plurality of second wires protruding from the one side of the second core and wound around the second core in a clockwise direction;
   a plurality of third wires protruding from the one side of the third core and wound around the third core in a clockwise direction; and
   a plurality of fourth wires protruding from one side of the fourth core and wound around the fourth core in a counterclockwise direction,
   wherein any one of the plurality of first wires and any one of the plurality of second wires are connected at a first connector between the first core and the second core,
   the other one of the plurality of first wires and any one of the plurality of third wires are connected at a second connector between the first core and the third core,
   the other one of the plurality of second wires and any one of the plurality of fourth wires are connected at a third connector between the second core and the fourth core,
   the other one of the plurality of third wires and the other one of the plurality of fourth wires are connected at a fourth connector between the third core and the fourth core,
   the second connector and the third connector are connected to each other through a connection wire, and
   when a force is applied to the stretchable display in the X direction to expand the stretchable display, the first core and the fourth core rotate in the counterclockwise direction, the second core and the third core rotate in the clockwise direction, and thus distances between the first core to the fourth core in the X direction and the Y direction increase.

5. The stretchable display of claim 4, further comprising: an additional light emitting element installed in the connection wire.

6. The stretchable display of claim 5, wherein the additional light emitting element is positioned on a different layer from the first core to the fourth core.

7. The stretchable display of claim 5, further comprising:

a first reinforcement device formed outside the first connector in the Y direction and additionally connecting the first wire and the second wire of the first connector; and a second reinforcement device formed outside the fourth connector in the Y direction and additionally connecting the third wire and the fourth wire of the fourth connector.

8. The stretchable display of claim 7, wherein the Y direction is a stretching direction in which the stretchable display is expanded or contracted by an external force, and the X direction is a dependent direction in which the stretchable display is dependently expanded or contracted according to the expansion or contraction of the stretchable display in the stretching direction.

* * * * *